(12) United States Patent
Moraes et al.

(10) Patent No.: US 11,631,813 B2
(45) Date of Patent: Apr. 18, 2023

(54) DEPOSITION MASK AND METHODS OF MANUFACTURING AND USING A DEPOSITION MASK

(71) Applicant: Applied Materials, Inc., Santa Clara, CA (US)

(72) Inventors: Kevin Moraes, Mountain View, CA (US); Alexander N. Lerner, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 48 days.

(21) Appl. No.: 16/806,511

(22) Filed: Mar. 2, 2020

(65) Prior Publication Data

US 2020/0295265 A1    Sep. 17, 2020

Related U.S. Application Data

(60) Provisional application No. 62/819,364, filed on Mar. 15, 2019.

(51) Int. Cl.
| | |
|---|---|
| *H01L 51/00* | (2006.01) |
| *C23C 14/04* | (2006.01) |
| *C23C 14/02* | (2006.01) |
| *C23C 14/12* | (2006.01) |
| *H01L 51/42* | (2006.01) |

(52) U.S. Cl.
CPC ........ *H01L 51/0011* (2013.01); *C23C 14/022* (2013.01); *C23C 14/042* (2013.01); *C23C 14/12* (2013.01); *H01L 51/42* (2013.01)

(58) Field of Classification Search
CPC .............. H01L 51/0011; C23C 14/042; C23C 14/5873; H01J 2237/31711; H01J 2237/31794; G03F 1/20
See application file for complete search history.

(56) References Cited

U.S. PATENT DOCUMENTS

| | | | |
|---|---|---|---|
| 6,319,636 B1 * | 11/2001 | Ham | .................. G03F 1/20 |
| | | | 430/296 |
| 7,148,502 B2 | 12/2006 | Yamazaki et al. | |
| (Continued) | | | |

FOREIGN PATENT DOCUMENTS

| | | |
|---|---|---|
| CN | 1490169 A | 4/2004 |
| CN | 102460129 A | 5/2012 |
| (Continued) | | |

OTHER PUBLICATIONS

International Search Report and Written Opinion for Application No. PCT/US2020/019020 dated Jun. 17, 2020.
(Continued)

*Primary Examiner* — Jaehwan Oh
(74) *Attorney, Agent, or Firm* — Patterson + Sheridan, LLP

(57) ABSTRACT

Generally, examples described herein relate to deposition masks and methods of manufacturing and using such deposition masks. An example includes a method for forming a deposition mask. A mask layer is deposited on a substrate. Mask openings are patterned through the mask layer. A central portion of the substrate is removed to define a substrate opening through a periphery portion of the substrate. The mask layer with the mask openings through the mask layer extending across the substrate opening.

15 Claims, 10 Drawing Sheets

(56) References Cited

U.S. PATENT DOCUMENTS

| | | | |
|---|---|---|---|
| 7,824,825 B2 * | 11/2010 | Nishiwaki | H01J 37/3174 430/296 |
| 7,834,538 B2 | 11/2010 | Yamazaki et al. | |
| 8,054,450 B2 | 11/2011 | Peckerar et al. | |
| 8,891,152 B2 | 11/2014 | Fike, III et al. | |
| 8,912,712 B2 | 12/2014 | Yamazaki et al. | |
| 9,176,318 B2 | 11/2015 | Hagood et al. | |
| 9,229,222 B2 | 1/2016 | Hagood et al. | |
| 9,274,333 B2 | 3/2016 | Hagood, IV et al. | |
| 2003/0010749 A1 * | 1/2003 | Yoshizawa | G03F 1/20 430/5 |
| 2007/0077501 A1 * | 4/2007 | Nishiwaki | G03F 1/20 430/296 |
| 2008/0188086 A1 * | 8/2008 | Ogasawara | H01L 21/32137 438/716 |
| 2012/0276743 A1 | 11/2012 | Won et al. | |
| 2014/0356769 A1 | 12/2014 | Prushinskiy et al. | |
| 2019/0144988 A1 | 5/2019 | Mizumura | |

FOREIGN PATENT DOCUMENTS

| | | |
|---|---|---|
| CN | 102482760 A | 5/2012 |
| CN | 103282540 B | 2/2015 |
| CN | 109554662 A | 4/2019 |
| EP | 470541 B1 | 10/1995 |
| EP | 1500716 B1 | 3/2007 |
| JP | H10270353 A | 10/1998 |
| JP | H11160856 A | 6/1999 |
| JP | 200337055 A | 2/2003 |
| JP | 200359819 A | 2/2003 |
| JP | 2003133218 A | 5/2003 |
| JP | 2003243296 A | 8/2003 |
| JP | 2003273002 A | 9/2003 |
| JP | 2004296206 A | 10/2004 |
| JP | 2004297027 A | 10/2004 |
| JP | 200539055 A | 2/2005 |
| JP | 200624602 A | 1/2006 |
| JP | 200624603 A | 1/2006 |
| JP | 200795411 A | 4/2007 |
| JP | 200878527 A | 4/2008 |
| JP | 2009076227 A | 4/2009 |
| JP | 2010116579 A | 5/2010 |
| JP | 2010135578 A | 6/2010 |
| JP | 4809288 B2 | 11/2011 |
| JP | 2012104393 A | 5/2012 |
| JP | 2013209700 A | 10/2013 |
| JP | 2013209710 A | 10/2013 |
| JP | 2013211139 A | 10/2013 |
| JP | 5570939 B2 | 8/2014 |
| JP | 2017057485 A | 3/2017 |
| JP | 2018003142 A | 1/2018 |
| JP | 2018003151 A | 1/2018 |
| JP | 6393802 B1 | 9/2018 |
| JP | 6448067 B2 | 1/2019 |
| JP | 6461235 B2 | 1/2019 |
| JP | 6468540 B2 | 2/2019 |
| JP | 2019039072 A | 3/2019 |
| JP | 2019083311 A | 5/2019 |
| KR | 101322530 B1 | 10/2013 |
| KR | 101979149 B1 | 5/2019 |
| WO | 2014036893 A1 | 3/2014 |
| WO | 2014112512 A1 | 7/2014 |
| WO | 2017222009 A1 | 12/2017 |

OTHER PUBLICATIONS

Office Action for Japanese Patent Application No. 2021-555594 dated Nov. 15, 2022.

* cited by examiner

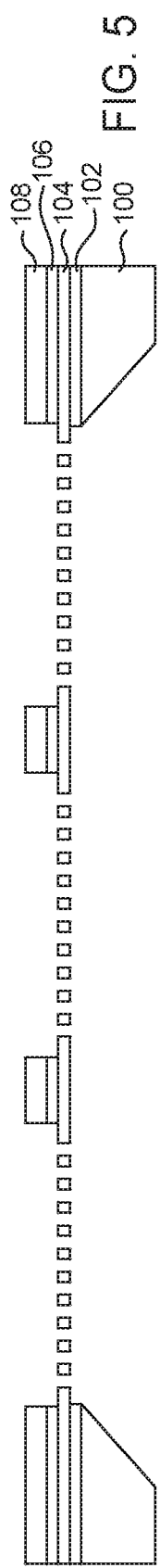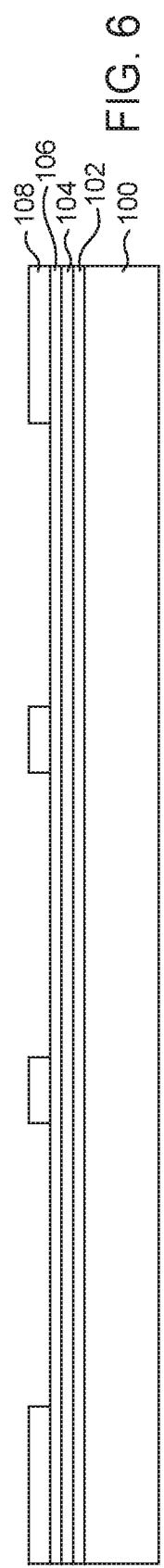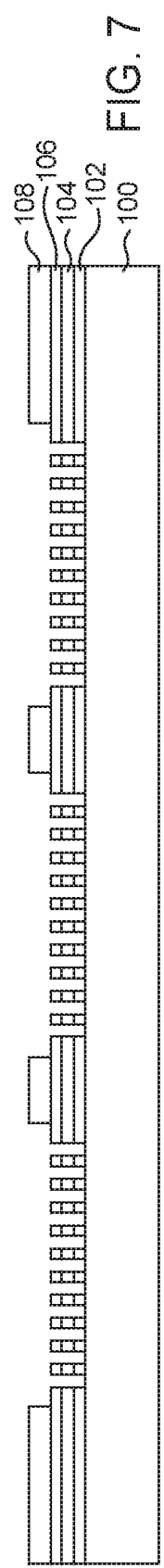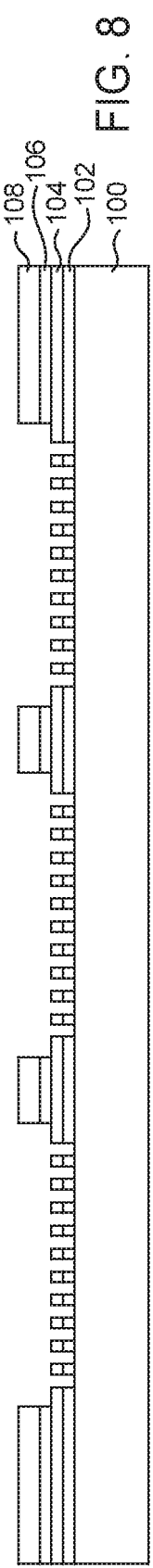

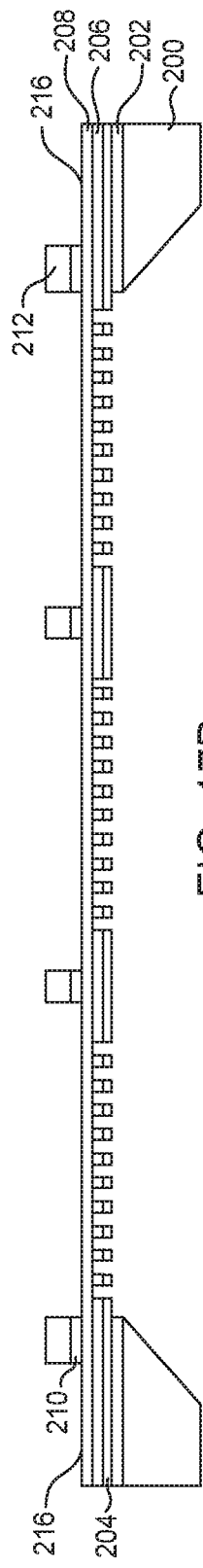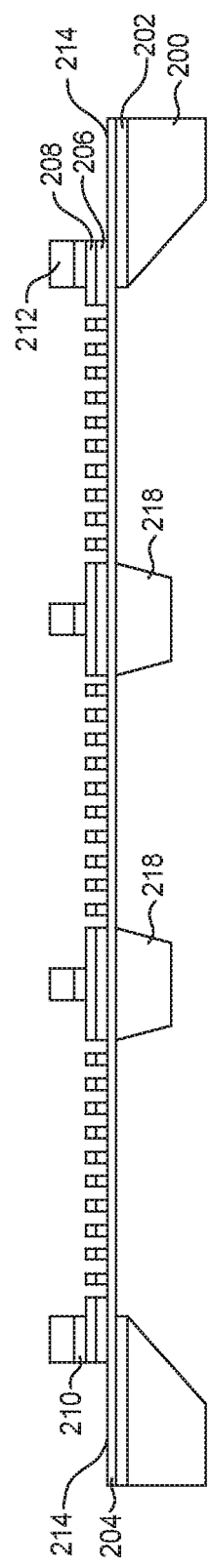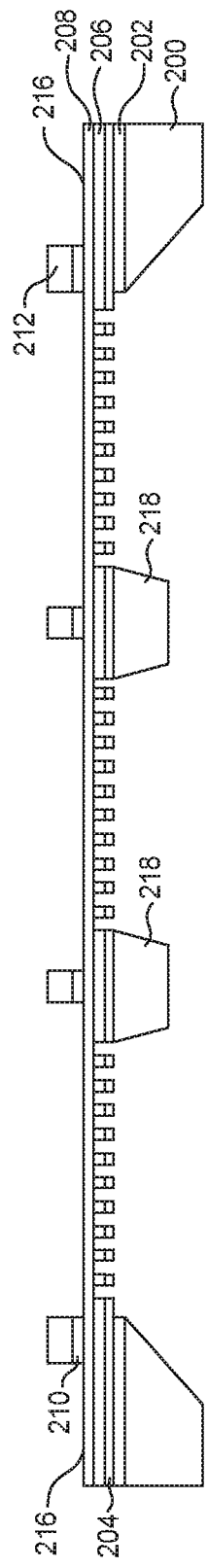
FIG. 17B
FIG. 18A
FIG. 18B

DEPOSITION MASK AND METHODS OF MANUFACTURING AND USING A DEPOSITION MASK

CROSS-REFERENCE TO RELATED APPLICATIONS

This application claims priority to and the benefit of U.S. Provisional Patent Application No. 62/819,364, entitled "Deposition Mask and Methods of Manufacturing and Using A Deposition Mask," filed on Mar. 15, 2019, which is incorporated herein by reference in its entirety.

BACKGROUND

Field

Examples described herein generally relate to the field of semiconductor processing, and more specifically, to a deposition mask, including methods of manufacturing and using such, used in semiconductor processing.

Description of the Related Art

Masks (e.g., hard masks) can be used in a variety of processes in semiconductor processing. Masks have been commonly used during etch processes. Masks are being developed to be utilized to selectively deposit material on a substrate. In such cases, a mask can have a predetermined pattern of openings formed through the mask to allow material to be deposited on the substrate below the mask at positions corresponding to the openings. However, dimensions of patterns of material to be deposited can create challenges when using a mask for selective deposition. Considering dimensions of semiconductor devices are likely to continue to decrease, such challenges can be amplified if not addressed.

SUMMARY

Some examples of the disclosure include a method for forming a deposition mask. A mask layer is deposited on a substrate. Mask openings are patterned through the mask layer. A central portion of the substrate is removed to define a substrate opening through a periphery portion of the substrate. The mask layer with the mask openings through the mask layer extends across the substrate opening.

Some examples of the disclosure include a semiconductor processing structure including a deposition mask. The deposition mask includes an annular substrate and a mask layer on the annular substrate. The annular substrate has a substrate opening through the annular substrate. The mask layer extends across the substrate opening. The mask layer has mask openings through the mask layer and aligned within the substrate opening.

Further examples of the disclosure include a method for semiconductor processing. A device substrate and a deposition mask are secured in a substrate carrier apparatus. The deposition mask is secured on the device substrate. The deposition mask includes an annular substrate and a mask layer on the annular substrate. The annular substrate has a substrate opening through the annular substrate. The mask layer extends across the substrate opening. The mask layer has mask openings through the mask layer and aligned within the substrate opening. The substrate carrier apparatus with the device substrate and the deposition mask secured therein is transported to a semiconductor processing chamber. In the semiconductor processing chamber, a material is deposited on the device substrate through the substrate opening and the mask openings.

BRIEF DESCRIPTION OF THE DRAWINGS

So that the manner in which the above recited features of the present disclosure can be understood in detail, a more particular description, briefly summarized above, may be had by reference to examples, some of which are illustrated in the appended drawings. It is to be noted, however, that the appended drawings illustrate only some examples and are therefore not to be considered limiting of the scope of this disclosure, for the disclosure may admit to other equally effective examples.

FIGS. 1 through 5 are a process flow for forming a deposition mask according to some examples.

FIGS. 6 through 10 are another process flow for forming a deposition mask according to some examples.

FIGS. 11 through 13, 14A, 14B, 15A, 15B, 16A, 16B, 17A, 17B, 18A, and 18B are another process flow for forming a deposition mask according to some examples.

To facilitate understanding, identical reference numerals have been used, wherever possible, to designate identical elements that are common to the figures.

DETAILED DESCRIPTION

Figure 1:
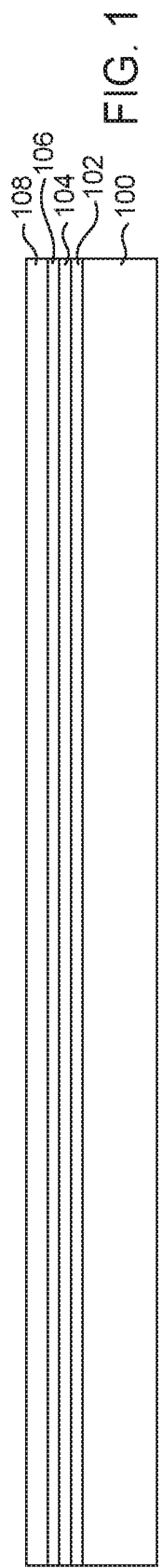

Generally, examples described herein relate to deposition masks and methods of manufacturing and using such deposition masks. Example deposition masks described herein can have characteristics that can be beneficial during the deposition process in which the deposition masks are used.

Deposition masks are being developed for selective deposition of material. As an example, different organic material can be selectively deposited for different, respective pixels in an image sensor, such as an image sensor utilizing an organic photoconductive film (OPF). Certain pixels (e.g., for sensing red light) can utilize a first organic material, while other pixels (e.g., for sensing green or blue light) can utilize a second, different organic material. A deposition mask can be used during a selective deposition process for depositing the first organic material on a substrate for some pixels, while another deposition mask can be used during another selective deposition process for depositing the second organic material on the substrate for other pixels.

A challenge has been observed during deposition using a deposition mask having openings that have small widths (e.g., for small pixel sizes) and relatively large depths, where the deposited material is deposited through the openings. In such a situation, the openings through which the material is deposited have a large aspect ratio, and the material can also be deposited on the deposition mask. Due to the large aspect ratio, the material deposited on the deposition mask can cause a pinch-off at corners of the openings that prevent the material that is being deposited from reaching the substrate that is the target of the deposition.

Some examples described herein can provide a deposition mask having openings that have a lower aspect ratio by providing a mask layer that is relatively thin. The thin mask layer permits the openings through the mask layer to have a decreased depth and, hence, a lower aspect ratio. The lower aspect ratio can reduce a risk of pinch-off occurring at the openings. Hence, the material that is being deposited may more likely reach the substrate that is the target of the deposition.

Some examples described herein can provide a deposition mask that includes a resistive heating element. The resistive heating element can have electrical current flowing therethrough during the deposition process, which can increase the temperature of the deposition mask. The increased temperature of the deposition mask can reduce deposition of the material on the deposition mask. The reduced deposition can reduce a risk of pinch-off occurring at the openings. Hence, the material that is being deposited may more likely reach the substrate that is the target of the deposition.

Additionally, methods of forming a deposition mask described herein can include using processing that may be commonly used in semiconductor processing. Accordingly, the deposition mask can be formed using ubiquitous tools and semiconductor processing.

Various different examples are described below. Although multiple features of different examples may be described together in a process flow or system, the multiple features can each be implemented separately or individually and/or in a different process flow or different system. Additionally, various process flows are described as being performed in an order; other examples can implement process flows in different orders and/or with more or fewer operations.

Some example process flows for forming a deposition mask are provided below. Figures corresponding to the process flows are provided. A person having ordinary skill in the art will easily understand that during various processing, the formed deposition mask and/or substrate used to form the deposition mask can be processed from both a front side and a backside of the substrate. The orientation of the substrate is illustrated in the figures the same throughout processing, although a person having ordinary skill in the art will understand that the orientation can change between various processing. Additionally, a person having ordinary skill in the art will understand that, although not illustrated, a carrier substrate can be used (e.g., along with an adhesive, like ultra-violet (UV) glue) to mechanically support the deposition mask and/or substrate during various processes.

FIGS. 1 through 5 illustrate a process flow for forming a deposition mask according to some examples. FIG. 1 illustrates the formation of layers on a substrate 100. The substrate 100 can be any substrate, such as a semiconductor (e.g., silicon) substrate, a glass substrate, a sapphire substrate, a titanium nitride substrate, or any other substrate. The substrate 100 generally has a size that corresponds with a size of a substrate on which a material is to be deposited using the deposition mask formed by the process flow of FIGS. 1 through 5. For example, the substrate 100 can have a diameter (if circular) that is equal to or larger than a diameter (if circular) of the substrate on which the material is to be deposited using the deposition mask. In some examples, the substrate 100 is a silicon wafer.

A first protective layer 102 is deposited on the substrate 100. The first protective layer 102 can provide multiple functions. The first protective layer 102 can be a seed layer for deposition of a subsequent layer. The first protective layer 102 can be a diffusion barrier layer for a layer formed on the first protective layer 102. The first protective layer 102 can also serve as an etch stop layer by providing etch selectivity with adjoining layers and materials. The first protective layer 102 can be any appropriate material. The first protective layer 102 can be or include a metal, an insulating material, or any other material. In some examples, the first protective layer 102 can be or include copper (Cu), aluminum (Al), tungsten (W), or any other appropriate material. The first protective layer 102 can be deposited by any appropriate deposition process, such as a physical vapor deposition (PVD), a chemical vapor deposition process (CVD), and/or the like.

A mask layer 104 is deposited on the first protective layer 102. The mask layer 104 can be formed with a tensile stress, which can help the structural integrity of the deposition mask formed with the mask layer 104. The mask layer 104 can be any appropriate material. The mask layer 104 can be or include a material that is capable of being selectively etched relative to adjoining materials. The mask layer 104 may be a single layer of a material or may be multiple layers of various materials. In some examples, the mask layer 104 can be or include silicon nitride (SiN), silicon oxynitride (SiON), copper (Cu), aluminum (Al), tungsten (W), or any other appropriate material. The mask layer 104 can be or include a metal, an insulating material, or any other material. The mask layer 104 can be deposited by any appropriate deposition process, such as PVD, CVD, and/or the like.

A second protective layer 106 is deposited on the mask layer 104. The second protective layer 106 can provide multiple functions. The second protective layer 106 can be a diffusion barrier layer for the mask layer 104. The second protective layer 106 can also serve as an etch stop layer by providing etch selectivity with the mask layer 104 and an overlying layer. The second protective layer 106 can be any appropriate material. The second protective layer 106 can be or include a metal, an insulating material, or any other material. In some examples, the second protective layer 106 can be or include copper (Cu), aluminum (Al), tungsten (W), or any other appropriate material. The second protective layer 106 can be deposited by any appropriate deposition process, such as PVD, CVD, and/or the like.

A spacer layer 108 is deposited on the second protective layer 106. The spacer layer 108 can be formed into a spacer element that can provide for sufficient spacing between the deposition mask that is to be formed and an underlying substrate on which a material is deposited using the deposition mask. Accordingly, the spacer layer 108 can have a thickness corresponding to the target spacing. The spacer layer 108 can be any appropriate material. The spacer layer 108 can be or include a metal, an insulating material, or any other material. In some examples, the spacer layer 108 can be or include silicon nitride (SiN), silicon oxide (SiO), copper (Cu), aluminum (Al), tungsten (W), or any other appropriate material. The spacer layer 108 can be deposited by any appropriate deposition process, such as PVD, CVD, and/or the like.

For ease of reference herein, the side of the substrate 100 on which the layers 102, 104, 106, 108 are deposited may be referred to as the front side of the substrate 100, and processing of the substrate 100 and layers 102, 104, 106, 108 in a direction to the front side (e.g., without being through the substrate 100) may be referred to as front side processing. Hence, the processing of FIG. 1 may be referred to as front side processing. Conversely, the side of the substrate 100 opposite the front side of the substrate 100 may be referred to as the backside of the substrate 100, and processing of the substrate 100 and layers 102, 104, 106, 108 in a direction to the backside may be referred to as backside processing. A similar convention may be used in describing other process flows.

Figure 2:
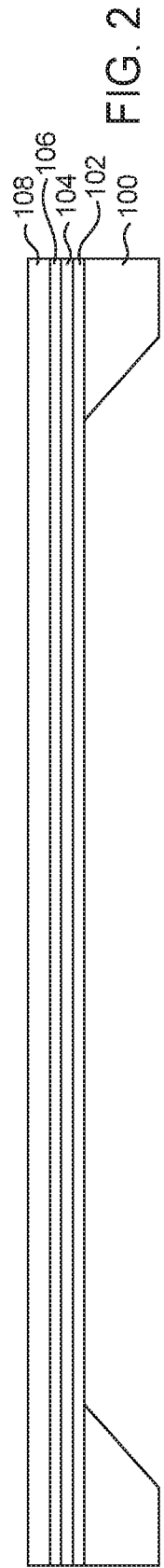

FIG. 2 illustrates removal of a central portion of the substrate 100 to define a substrate opening through the substrate 100. The central portion of the substrate 100 can be removed using appropriate photolithography and etching processes. For example, a reactive ion etch (RIE) may be used to etch the substrate 100. The remaining outer or periphery portion of the substrate 100 can circumscribe an area in which the deposition mask pattern is to be formed. The remaining outer or periphery portion of the substrate 100 may also be referred to as an annular substrate. As used herein, the term annular is not limited to circular closed shapes and may include other closed shapes such as, for example, rectangular, polygonal, etc. The removal of the central portion of the substrate 100 can be by backside processing.

Figure 3:
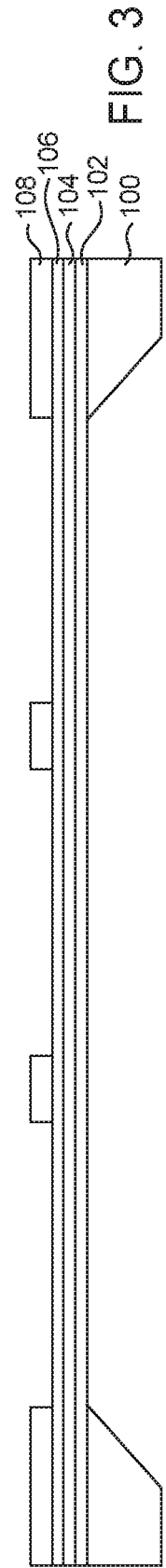

FIG. 3 illustrates the patterning of the spacer layer 108 into a spacer element. The spacer layer 108 can have portions removed in areas where a deposition mask pattern is to be formed. For example, portions of the spacer layer 108 can remain at an outer portion corresponding vertically (in the illustration) to the remaining outer or periphery portion of the substrate 100. Further, wide areas in which no mask openings are to be formed for the deposition mask can have respective portions of the spacer layer 108 remain. As an example, if a deposition mask has a pattern for each device or die on which a material is to be deposited, a wide area may be between each device or die (e.g., corresponding to scribe line areas) where a portion of the spacer layer 108 remains. The spacer layer 108 can be patterned using appropriate photolithography and etching processes, such as an RIE.

Figure 4:
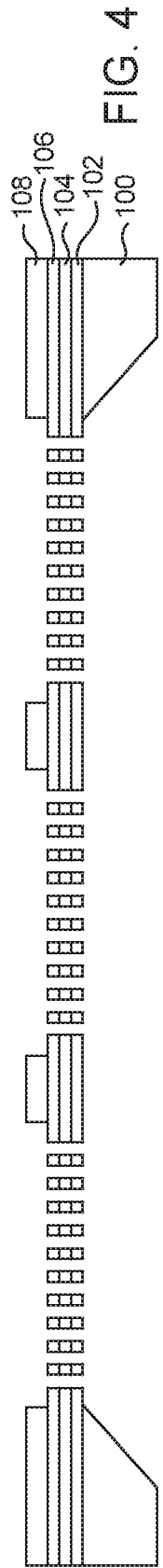

FIG. 4 illustrates patterning the second protective layer 106, mask layer 104, and first protective layer 102 to form mask openings through the layers 102, 104, 106. The mask openings correspond to the pattern of the material that is to be deposited using the deposition mask, and the mask openings are aligned within the substrate opening through the substrate 100. The layers 106, 104, 102 can be patterned using appropriate photolithography and etching processes, such as an RIE, which may be performed using front side or backside processing.

FIG. 5 illustrates the removal of exposed portions of the first protective layer 102 and second protective layer 106. In some examples, exposed portions of the second protective layer 106 are removed using a dry, anisotropic etch process, such as an RIE, during front side processing, and exposed portions of the first protective layer 102 are removed using a dry, anisotropic etch process, such as an RIE, during backside processing. In some examples, exposed portions of both the first protective layer 102 and the second protective layer 106 are removed in a same process step, such as using an isotropic etch process, which may be a wet process or a dry process.

A deposition mask can therefore be formed as shown in FIG. 5. The mask layer 104 has mask openings therethrough in the pattern formed by the processing described with respect to FIG. 4. The mask openings through the mask layer 104 can have an aspect ratio of a depth (e.g., a thickness of the mask layer 104 or dimension of the opening perpendicular to a major plane of the mask layer 104) to a width (e.g., a dimension perpendicular to the depth) that is sufficiently low to permit deposition of a material through the openings to another substrate, e.g., without pinching off at the openings by the material being deposited on the mask layer 104. In some examples, the aspect ratio of the openings can be 1:1 or less. In some examples, the thickness of the mask layer 104, and hence, a depth of the openings, can be in a range from about 2 µm to about 3 µm, and a width of the openings can be in a range from about 2 µm to about 3 µm. In some examples, the width of the openings can be greater than the thickness of the mask layer 104.

The remaining outer or periphery portion of the substrate 100 circumscribes the patterned portion of the mask layer 104. The remaining outer or periphery portion of the substrate 100 can therefore provide mechanical support to the mask layer 104 for handling and transporting the deposition mask. The tensile stress of the mask layer 104 can cause the mask layer 104 to remain rigid extending across the substrate opening through the substrate 100.

FIGS. 6 through 10 illustrate another process flow for forming a deposition mask according to some examples. A first protective layer 102, mask layer 104, second protective layer 106, and spacer layer 108 are deposited on a substrate 100 as described above with respect to, and as illustrated in, FIG. 1.

In FIGS. 6 and 7, front side processing continues with the spacer layer 108 being patterned as described above with respect to FIG. 3, and with patterning of the second protective layer 106, mask layer 104, and first protective layer 102 as described above with respect to FIG. 4. FIG. 8 illustrates the removal of exposed portions of the second protective layer 106, such as by using a dry, anisotropic etch process, such as an RIE, during front side processing.

Figure 9:
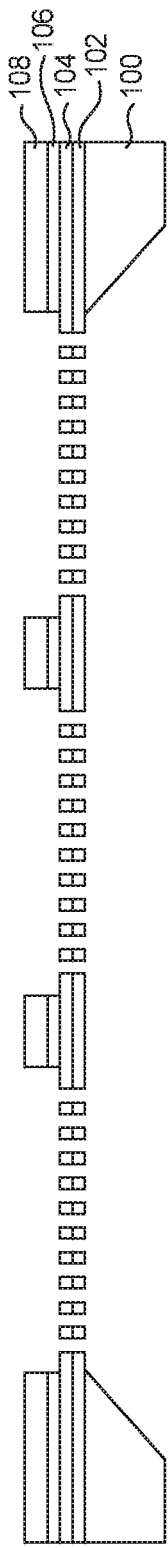
Figure 10:
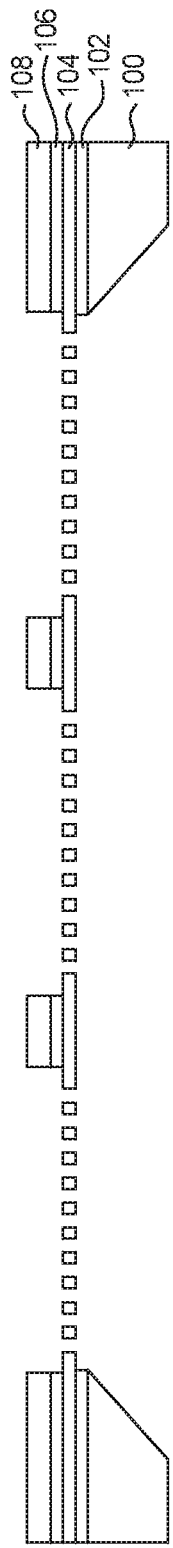

In FIG. 9, in backside processing, the central portion of the substrate 100 is removed as described above with respect to FIG. 2. FIG. 10 illustrates the removal of exposed portions of the first protective layer 102, such as by using a dry, anisotropic etch process, such as an RIE, during backside processing. The deposition mask as shown in FIG. 10 can have the same or similar properties and characteristics as the deposition mask of FIG. 5 as described above.

Figure 19:
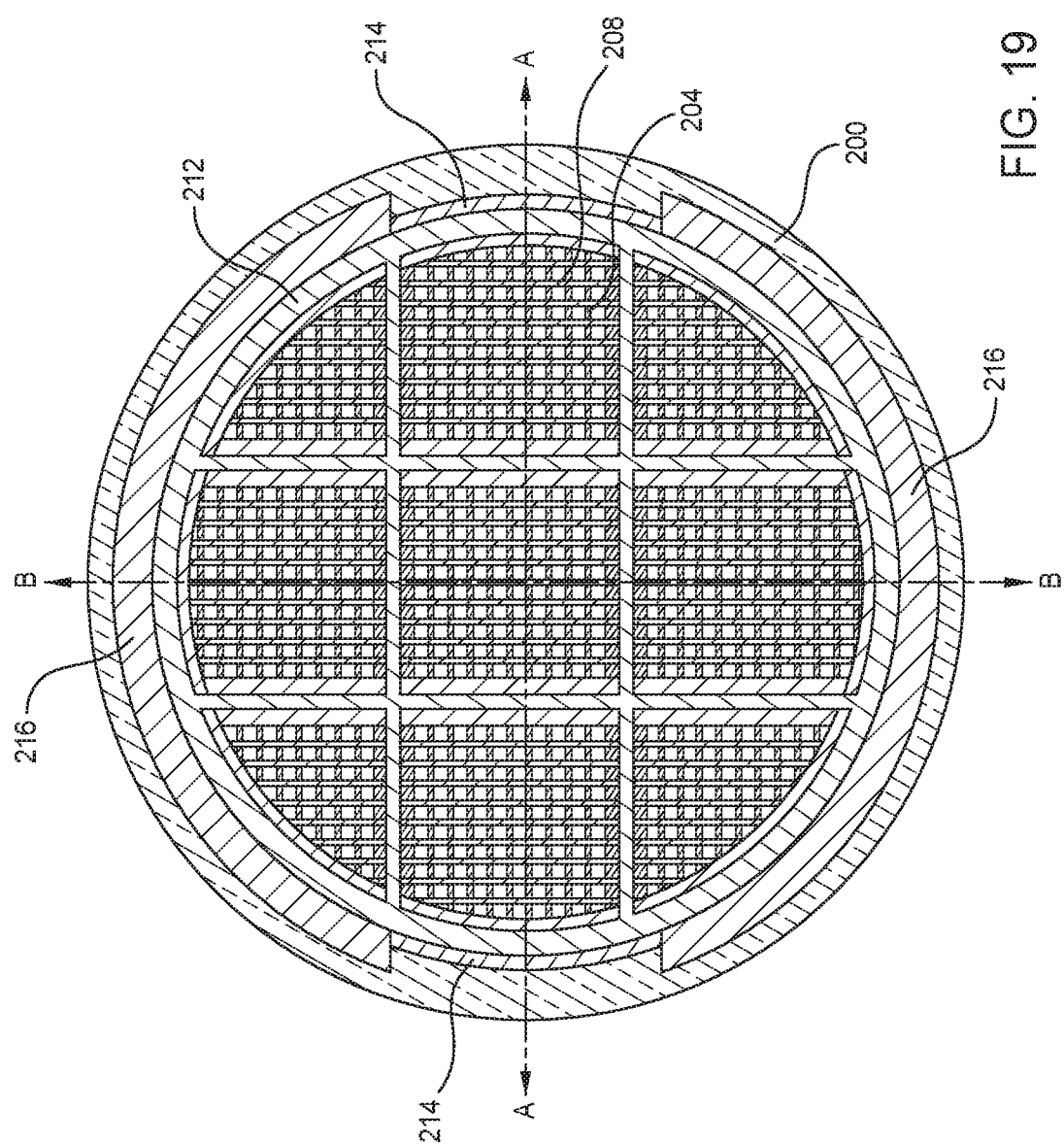
FIGS. 19 and 20 are a front side view and a backside view, respectively, of a deposition mask according to some examples.
Figure 20:
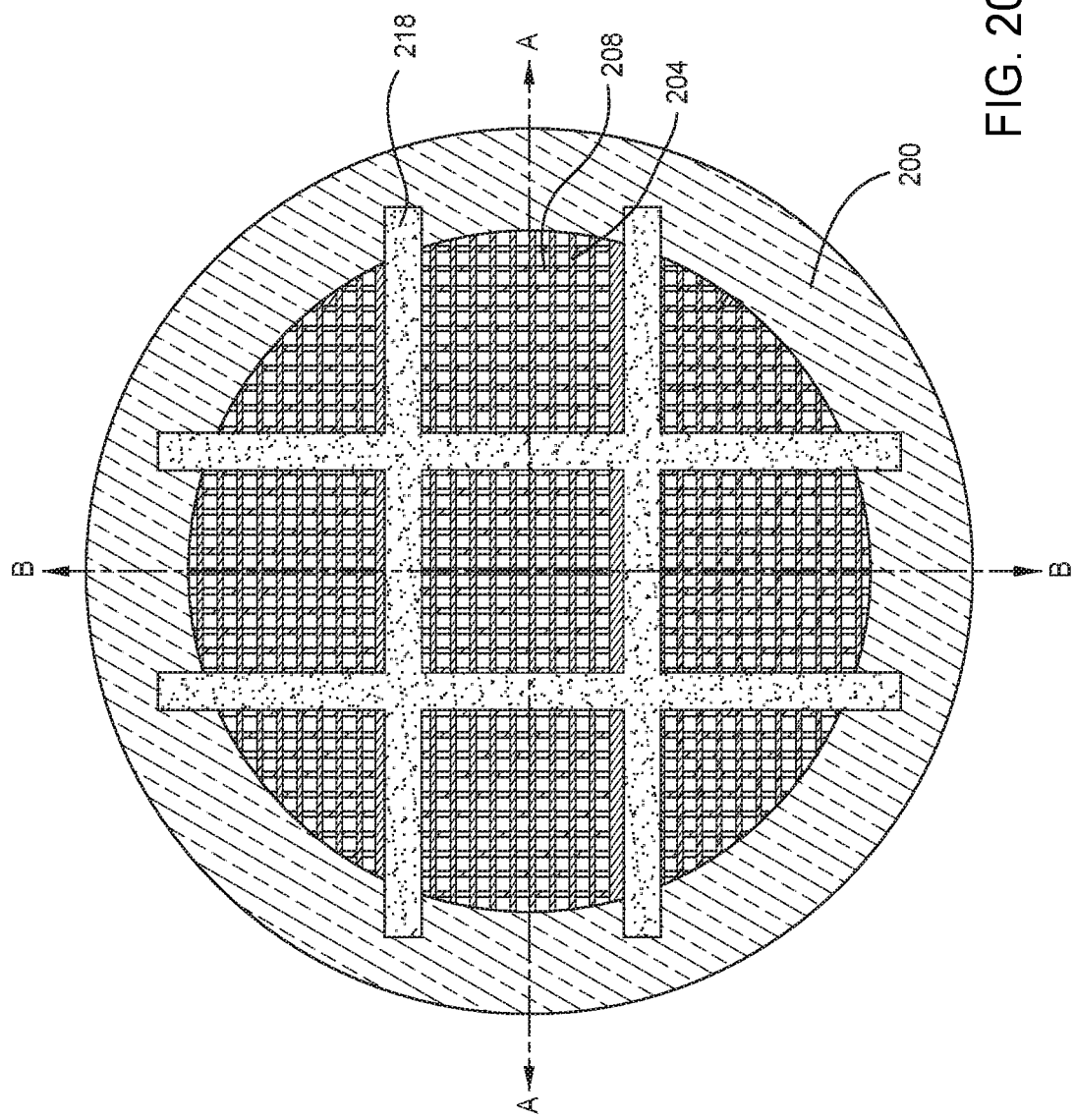

FIGS. 11 through 13, 14A, 14B, 15A, 15B, 16A, 16B, 17A, 17B, 18A, and 18B illustrate another process flow for forming a deposition mask according to some examples. FIG. 19 illustrates a front side view of the deposition mask that is formed, and FIG. 20 illustrates a backside view of the deposition mask that is formed. FIGS. 19 and 20 illustrate cross-sections A-A and B-B, which are perpendicular to each other. Cross-section A-A corresponds to figures ending in an "A" designation during processing, and cross-section B-B corresponds to figures ending in a "B" designation during processing.

Figure 11:
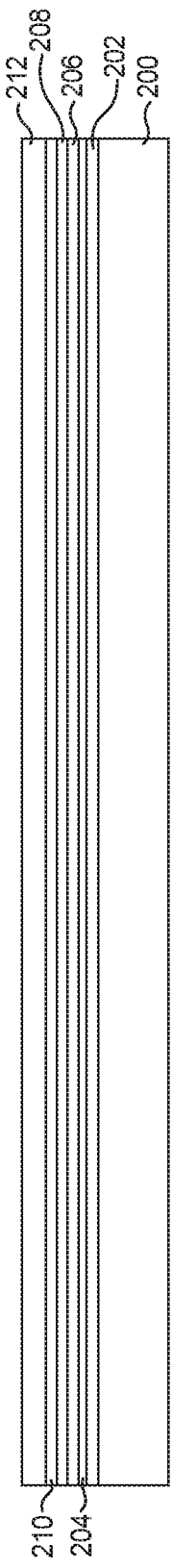

FIG. 11 illustrates the formation of layers on a substrate 200. The substrate 200 can be any substrate, like previously described for the substrate 100. A first protective layer 202 is deposited on the substrate 200, like previously described for the first protective layer 102.

A first conductive mask layer 204 is deposited on the first protective layer 202. An insulator mask layer 206 is deposited on the first conductive mask layer 204. A second conductive mask layer 208 is deposited on the insulator mask layer 206. Each of the first conductive mask layer 204, insulator mask layer 206, and second conductive mask layer 208 can be formed with a tensile stress, which can help the structural integrity of the deposition mask formed with the mask layers 204, 206, 208. The first conductive mask layer 204 and second conductive mask layer 208 can each be any appropriate conductive material, e.g., that may be used to form a resistive heating element. The first conductive mask layer 204 and second conductive mask layer 208 can each be or include a material that is capable of being selectively etched relative to adjoining materials. In some examples, the first conductive mask layer 204 and second conductive mask layer 208 can each be or include a metal, such as copper (Cu), aluminum (Al), tungsten (W), or any other metal. The insulator mask layer 206 can be any electrically insulating material between the first conductive mask layer 204 and the second conductive mask layer 208. The insulator mask layer 206 can also be or include a material that is capable of being selectively etched relative to the first conductive mask layer 204 and the second conductive mask layer 208. In some examples, the insulator mask layer 206 can be or include silicon nitride (SiN), silicon oxynitride (SiON), or any other insulating material. The mask layers 204, 206, 208 can be deposited by any appropriate deposition process, such as PVD, CVD, and/or the like.

As will become apparent, the first conductive mask layer 204 is to be formed into a resistive heating element through which electrical current flows to generate an increased temperature or heat. The first conductive mask layer 204 is to be patterned such that electrical current flows in planes parallel to the cross-section A-A. Similarly, the second conductive mask layer 208 is also to be formed into a resistive heating element through which electrical current flows to generate an increased temperature or heat. The second conductive mask layer 208 is to be patterned such that electrical current flows in planes parallel to the cross-section B-B. The insulator mask layer 206 provides electrical isolation between the first conductive mask layer 204 and the second conductive mask layer 208 when the conductive mask layers 204, 208 are used as respective resistive heating elements.

A second protective layer 210 is deposited on the second conductive mask layer 208, like previously described for the second protective layer 106. A spacer layer 212 is deposited on the second protective layer 210, like previously described for the spacer layer 108.

Figure 12:
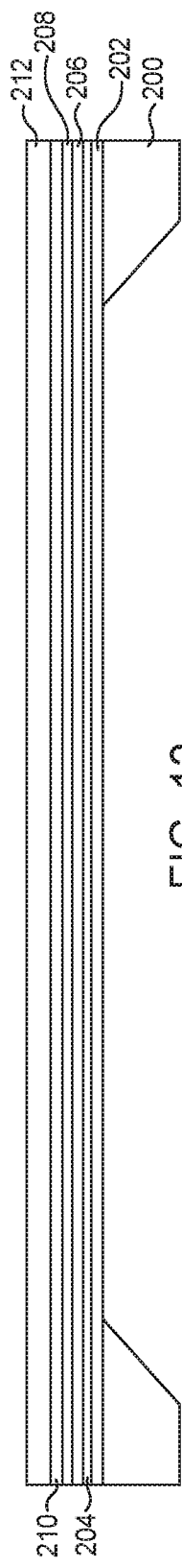
Figure 13:
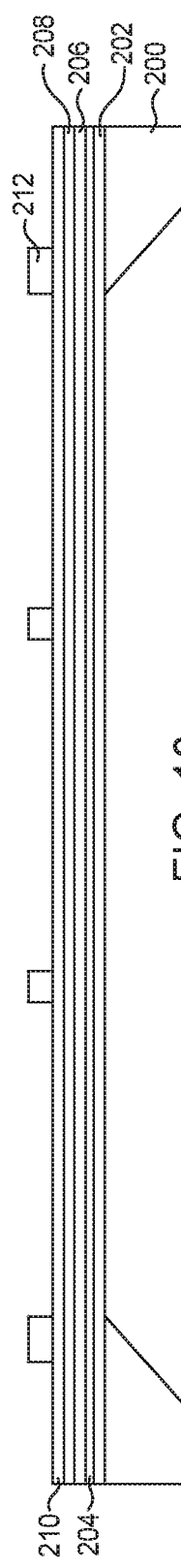

FIG. 12 illustrates removal of a central portion of the substrate 200, like previously described for the substrate 100 with respect to FIG. 2. FIG. 13 illustrates the patterning of the spacer layer 212, like previously described for the spacer layer 108 with respect to FIG. 3.

Figure 14A:
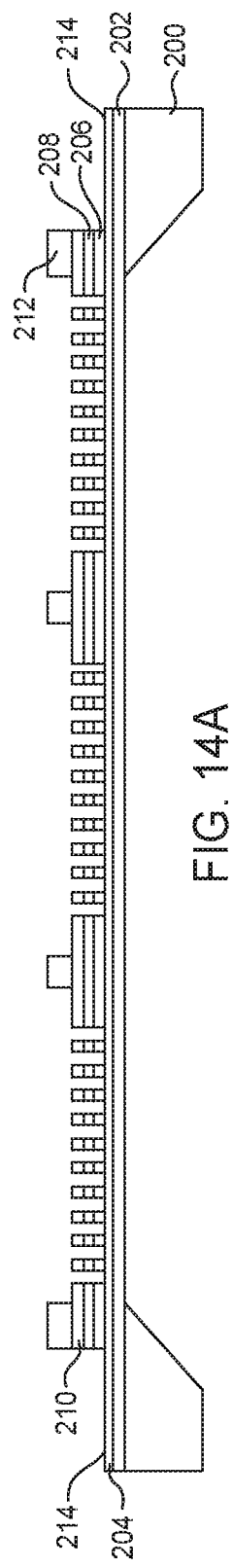
Figure 14B:

FIGS. 14A and 14B illustrate patterning the second protective layer 210, the second conductive mask layer 208, and the insulator mask layer 206. The patterning in FIGS. 14A and 14B forms b-direction trenches parallel to cross-section B-B (and perpendicular to cross-section A-A) through the second protective layer 210, second conductive mask layer 208, and insulator mask layer 206. Hence, the patterning forms b-direction lines of the second protective layer 210, the second conductive mask layer 208, and the insulator mask layer 206 parallel to cross-section B-B in the patterned area. Additionally, the patterning removes some laterally outer portions of the second protective layer 210, second conductive mask layer 208, and insulator mask layer 206 to expose contact areas 214 of the first conductive mask layer 204, as shown in FIG. 14A. Some other laterally outer portions of the second conductive mask layer 208 remain, as shown in FIG. 14B, which can form contact areas of the second conductive mask layer 208.

Figure 15A:
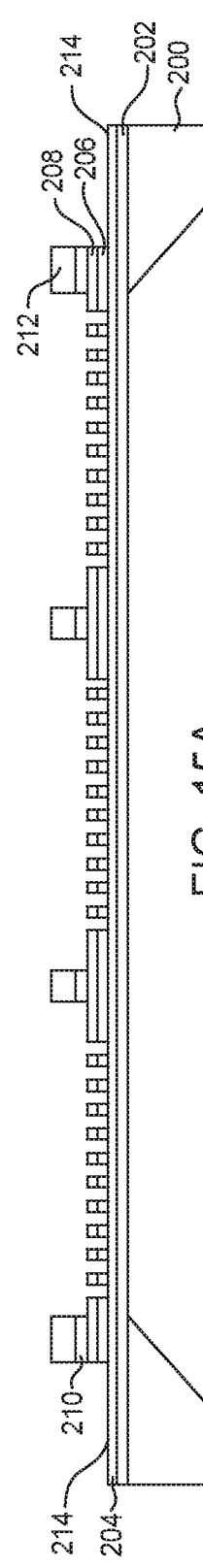
Figure 15B:
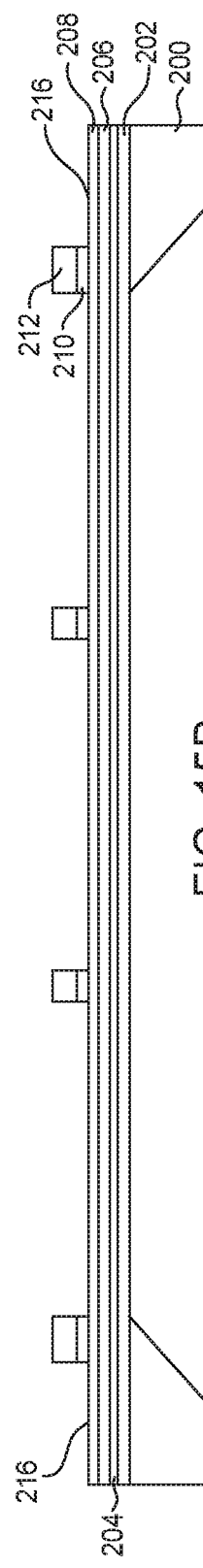

FIGS. 15A and 15B illustrate the removal of exposed portions of the second protective layer 210, such as by using a dry, anisotropic etch process, such as an RIE, during front side processing. Removal of the exposed portions of the second protective layer 210 expose contact areas 216 of the second conductive mask layer 208 as shown in FIG. 15B.

Figure 16A:
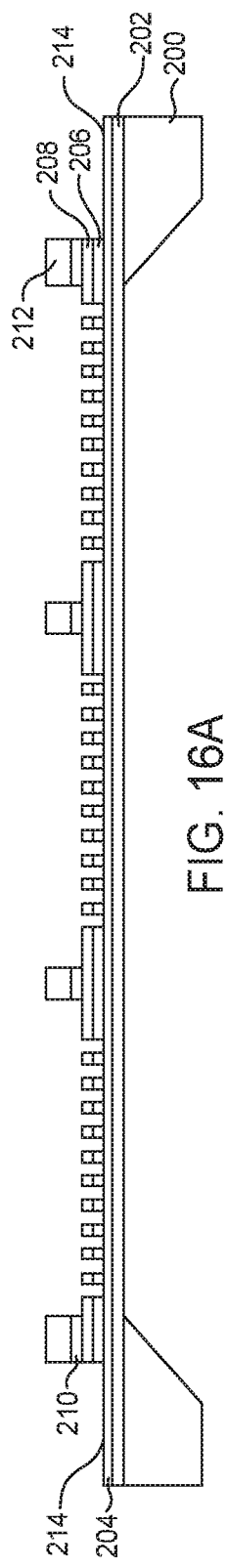
Figure 16B:
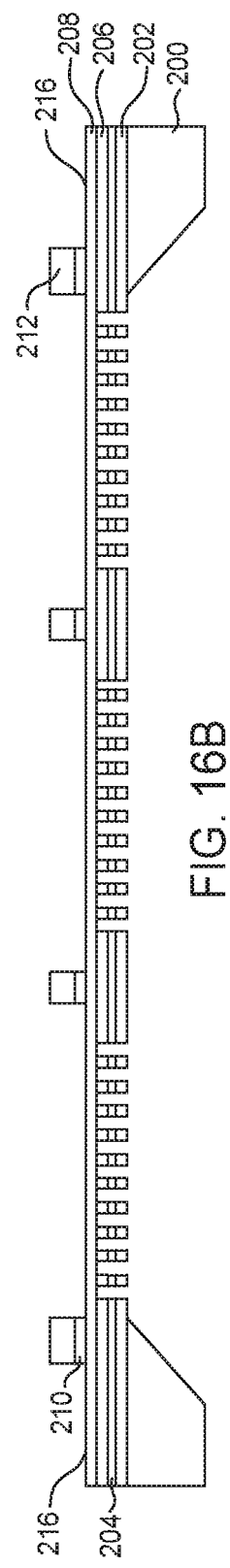

FIGS. 16A and 16B illustrate patterning the first protective layer 202, the first conductive mask layer 204, and the insulator mask layer 206. The patterning in FIGS. 16A and 16B forms a-direction trenches parallel to cross-section A-A (and perpendicular to cross-section B-B) through the first protective layer 202, first conductive mask layer 204, and insulator mask layer 206. Hence, the patterning forms a-direction lines of the first protective layer 202, the first conductive mask layer 204, and the insulator mask layer 206 parallel to cross-section A-A in the patterned area. Intersections of the a-direction trenches and b-direction trenches form the mask openings of the deposition mask. As illustrated, no trench individually extends through the mask layers 204, 206, 208. At intersections of a-direction trenches and b-direction trenches, the trenches combine to form the mask openings.

Figure 17A:
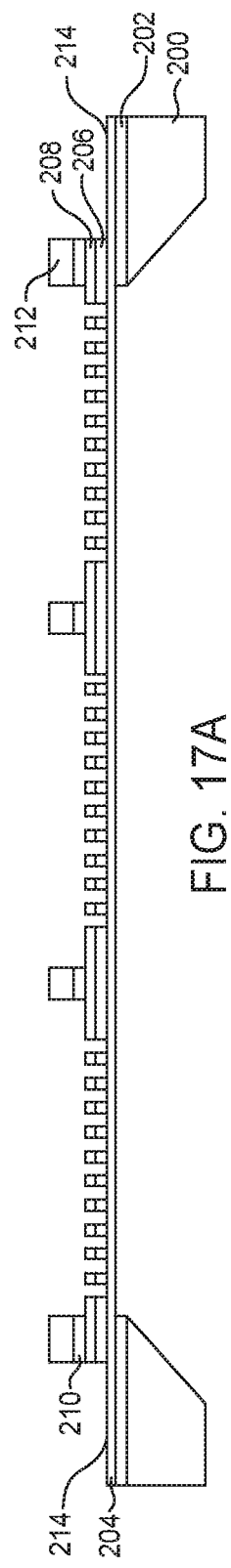

FIGS. 17A and 17B illustrate the removal of exposed portions of the first protective layer 202, such as by using a dry, anisotropic etch process, such as an RIE, during backside processing.

FIGS. 18A and 18B illustrate the formation of a support matrix 218. The support matrix 218 can be formed in the substrate opening and on the first conductive mask layer 204 by backside processing. The support matrix 218 can bridge across the substrate opening of the substrate 200 between opposing sections of the outer or periphery portion of the substrate 200, such as illustrated in FIG. 20. The support matrix 218 can be formed on wide areas of the first conductive mask layer 204 through which no mask openings are formed. As an example, if a deposition mask has a pattern for each device or die on which a material is to be deposited, a wide area may be between each device or die (e.g., corresponding to scribe line areas) where a portion of the support matrix 218 is disposed. Hence, the support matrix 218 can provide additional mechanical support to the mask layers 204, 206, 208. A support layer can be deposited, such as by any appropriate deposition process like PVD, CVD, or the like, and patterned, such as by appropriate lithography and etching processes like RIE, into the support matrix 218.

FIGS. 19 and 20 illustrate a front side view and a backside view, respectively, of the deposition mask. Mask openings are formed through the mask layers 204, 206, 208 where a-direction trenches (formed with respect to FIGS. 16A and 16B) and b-direction trenches (formed with respect to FIGS. 14A and 14B) intersect. The openings through the mask layers 204, 206, 208 can have an aspect ratio of a depth (e.g., a combined thickness of the mask layers 204, 206, 208 or dimension of the opening perpendicular to any major plane of the mask layers 204, 206, 208) to a width (e.g., a dimension perpendicular to the depth) that is sufficiently low to permit deposition of a material through the openings to another substrate, e.g., without pinching off at the openings by the material being deposited on the mask layers 204, 206, 208. In some examples, the aspect ratio of the openings can be 1:1 or less. In some examples, the combined thickness of the mask layers 204, 206, 208, and hence, a depth of the openings, can be in a range from about 2 μm to about 3 μm, and a width of the openings can be in a range from about 2 μm to about 3 μm. In some examples, the width of the openings can be greater than the combined thickness of the mask layers 204, 206, 208.

In some examples, the aspect ratio can be greater than 1:1. As described previously, the conductive mask layers 204, 208 can be resistive heating elements. When the conductive mask layers 204, 208 are used as resistive heating elements during a deposition process, less material being deposited by the deposition process may be deposited on the conductive mask layers 204, 208, and hence, pinch-off at openings through the conductive mask layers 204, 208 can be reduced. With the reduction in pinch-off, the aspect ratio of the openings can be increased.

FIGS. 19 and 20 illustrate the a-direction lines formed by the patterned first conductive mask layer 204 and the b-direction lines formed by the patterned second conductive mask layer 208. Additionally, FIG. 19 illustrates the contact areas 214 of the first conductive mask layer 204 and the contact areas 216 of the second conductive mask layer 208 on the front side of the annular substrate 200. Further, FIG. 19 shows the pattern of the spacer layer 212 on the annular substrate 200 and along areas corresponding to scribe lines of devices or dies of a substrate on which a material is to be deposited using the deposition mask. FIG. 20 shows the support matrix 218 bridging between sections of the annular substrate 200 across the substrate opening and the patterned area of the deposition mask.

A person having ordinary skill in the art will readily understand that various aspects of the different process flows and of the deposition masks thus formed can be incorporated into other process flows and/or deposition masks. For example, the support matrix 218 shown in FIGS. 18A and 18B can be incorporated into the deposition masks of FIGS. 5 and/or 10, and the respective process flows can be modified to incorporate the formation of the support matrix. Additionally, process flows can be modified, such as by a change in sequence and/or by including more or fewer processes. As an example, the process flow of FIGS. 6 through 10 illustrates a change in sequence of the process flow of FIGS. 1 through 5. Similarly, the process flow of FIGS. 11 through 18A-B can be modified such that front side processing is performed before back side processing.

Figure 21:
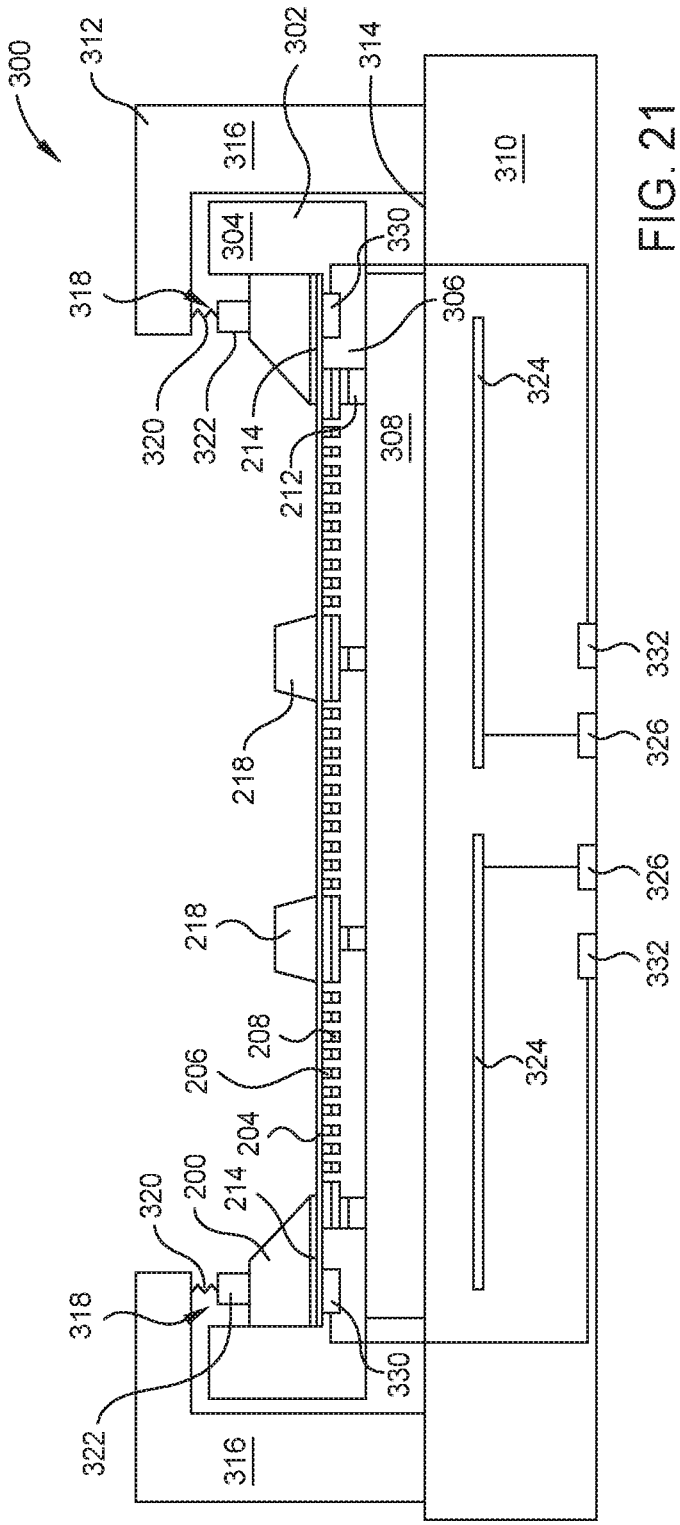
FIG. 21 is a deposition mask in a substrate carrier apparatus according to some examples.

FIG. 21 illustrates the deposition mask of FIGS. 18A-B, 19, and 20 in a substrate carrier apparatus 300. In other examples, the deposition mask of FIGS. 5 and 10 can be used in a similar substrate carrier apparatus. Various modifications to the illustrated substrate carrier apparatus 300 that can be made to implement the deposition mask of FIGS. 5 and 10 are noted herein, although a person having ordinary skill in the art will readily understand the various modifications that can be made.

A deposition mask can have a carrier frame 302 attached to the deposition mask. The carrier frame 302 can be a rigid frame that provides additional mechanical support to the deposition mask. For example, the carrier frame 302 can provide additional support for handling and transporting the deposition mask. In the context of FIG. 21, a carrier frame 302 is attached to the deposition mask. The carrier frame 302 includes an outer frame 304 and an inner flange 306. The carrier frame 302 can be formed of any rigid material. In some examples, such as for the deposition mask of FIGS. 5 and 10, the carrier frame 302 can be a metal. In some examples, such as for the deposition mask of FIGS. 18A-B, 19, and 20, the carrier frame 302 can be formed of a dielectric material or a dielectric coated metal, for example. A carrier frame 302 for the deposition mask of FIGS. 18A-B, 19, and 20 should be formed in a manner such that the first conductive mask layer 204 is not electrically connected to, or is electrically isolated from, the second conductive mask layer 208 when the carrier frame 302 is attached to the deposition mask. Accordingly, forming the carrier frame 302 of a dielectric material or coating the carrier frame 302 with a dielectric material can prevent causing an electrical connection between the first conductive mask layer 204 and the second conductive mask layer 208. The outer frame 304 laterally circumscribes the deposition mask (e.g., laterally circumscribes the annular substrate 200), and the inner flange 306 contacts the front side of the deposition mask along a lateral periphery of the deposition mask. The carrier frame 302 can be bonded or adhered to the deposition mask.

For example, an adhesive can adhere the inner flange 306 to the lateral periphery of the deposition mask. The inner flange can have a thickness (e.g., in a direction perpendicular to the front side surface of the substrate 200 when the carrier frame 302 is attached to the deposition mask) that causes a surface of the inner flange 306 opposite from the substrate 200 to be substantially co-planar with a surface of the spacer element formed from the spacer layer 212 opposite from the substrate 200.

The substrate carrier apparatus 300 can secure the deposition mask (with carrier frame 302 attached) on a device substrate 308. The substrate carrier apparatus 300 includes a carrier body 310 and a mask holder assembly 312 above. The carrier body 310 includes a support surface 314 to support the device substrate 308. In some examples, the carrier body 310 is formed of a non-metallic material such as, for example, alumina, silicon, etc. In some examples, the support surface 314 may be textured to minimize or substantially prevent the device substrate 308 from moving along the support surface 314 during handling of the substrate carrier apparatus 300. The mask holder assembly 312 is disposed above the support surface 314 and includes an annular frame 316 disposed atop the support surface 314. The mask holder assembly 312 also includes a flexure element 318 coupled to the annular frame 316.

The device substrate 308 is disposed on the support surface 314, and the deposition mask is disposed on the device substrate 308. The deposition mask is disposed within the annular frame 316 such that the deposition mask sits directly above the device substrate 308. The mask openings through the deposition mask are positioned to selectively allow material to be deposited through the mask openings onto the device substrate 308 at positions corresponding to the mask openings. The spacer element of the spacer layer 212 extends to the top surface of the device substrate 308 to maintain a predetermined gap between the mask layers 208, 206, 204 and the device substrate 308. Similarly, the surface of the inner flange 306 opposite from the substrate 200 is on the top surface of the device substrate 308.

The flexure element 318 couples the annular frame 316 to the deposition mask. The flexure element 318 is also coupled to the deposition mask at an end of the flexure element 318 opposite the annular frame 316. In some examples, the flexure element 318 may be welded to both the annular frame 316 and the deposition mask. In some examples, the flexure element 318 may be brazed or glued to both the annular frame 316 and the deposition mask. As depicted in FIG. 21, in some examples, the flexure element 318 includes a plurality of springs 320 coupled (e.g., via welding, brazing, or adhesive) to a corresponding plurality of coupling bodies 322. In some examples, the flexure element 318 may include elastomeric members instead of and/or in addition to the springs 320. Substrates (e.g., device substrate 308) typically have thickness variations across the substrate. The flexure element 318 can compensate for such thickness variations by allowing for a scenario in which the deposition mask is not perfectly horizontal while still ensuring that the annular frame 316 sits flush against the support surface 314.

The carrier body 310 can be a portable electrostatic chuck (ESC) configured to hold the device substrate 308 atop the support surface 314 of the carrier body 310 using electrostatic forces. In some examples, the carrier body 310 may include one or more electrodes 324 and one or more corresponding electrical leads 326 configured to couple electric power to the one or more electrodes 324 to electrostatically chuck the device substrate 308 onto the support surface 314.

After power is applied to the one or more electrodes 324 to chuck the device substrate 308 onto the support surface 314, the electrostatic chucking forces remain with the carrier body 310 and the device substrate 308 even after power is no longer supplied to the one or more electrodes 324 (e.g., during transfer of the substrate carrier apparatus 300 to/from the processing chamber). As such, the device substrate 308 can be prevented from moving during transfer of the substrate carrier apparatus 300 during handling.

To remove the device substrate 308 from the carrier body 310, power having an opposite charge than the chucking power is supplied to the one or more electrical leads 326 to allow the device substrate 308 to be removed. The carrier body 310 may include any structure to facilitate placement and removal of the device substrate 308 onto/from the support surface 314. For example, the carrier body 310 may include lift pin holes (not shown) to allow lift pins to raise and lower the device substrate 308 onto/from the support surface 314 or grooves (not shown) to allow an end effector to pass underneath the device substrate 308 for placement and removal of the device substrate 308.

In some examples, such as with the deposition mask of FIGS. 18A-B, 19, and 20, the carrier frame 302 includes contacts 330. The contacts 330 can establish an electrical connection with respective contact areas 214, 216 of the first conductive mask layer 204 and second conductive mask layer 208. As illustrated, the contacts 330 are embedded in the inner flange 306 of the carrier frame 302. At least four contacts 330 (two not shown in FIG. 21) are embedded in the inner flange 306. Each of the contacts 330 is configured to establish electrical contact with a respective one of the contact areas 214, 216 of the deposition mask. The contacts 330 in the carrier frame 302 are electrically connected to corresponding electrical leads 332 in the carrier body 310 that are configured to couple electric power to the contacts 330. The contacts 330 can be electrically connected to the leads 332 through the carrier frame 302 contacting the carrier body 310 (e.g., with electrical paths being formed through the carrier frame 302 and carrier body 310) and/or through the carrier frame 302, annular frame 316, and carrier body 310 (e.g., with electrical paths being formed through the carrier frame 302, annular frame 316, and carrier body 310).

During a deposition process, the substrate carrier apparatus 300 can be placed on a pedestal in a semiconductor processing chamber, and electrical contacts can be on the surface of the pedestal on which the substrate carrier apparatus 300 is placed. The leads 332 of the carrier body 310 can be placed in electrical contact with the electrical contacts of the pedestal such that power can be supplied through the pedestal to the contacts 330, and hence, current can flow through each of the first conductive mask layer 204 and the second conductive mask layer 208. By current flowing through the first conductive mask layer 204 and the second conductive mask layer 208, an increased temperature or heat may be generated in the deposition mask, which can reduce deposition of a material on the deposition mask.

Figure 22:
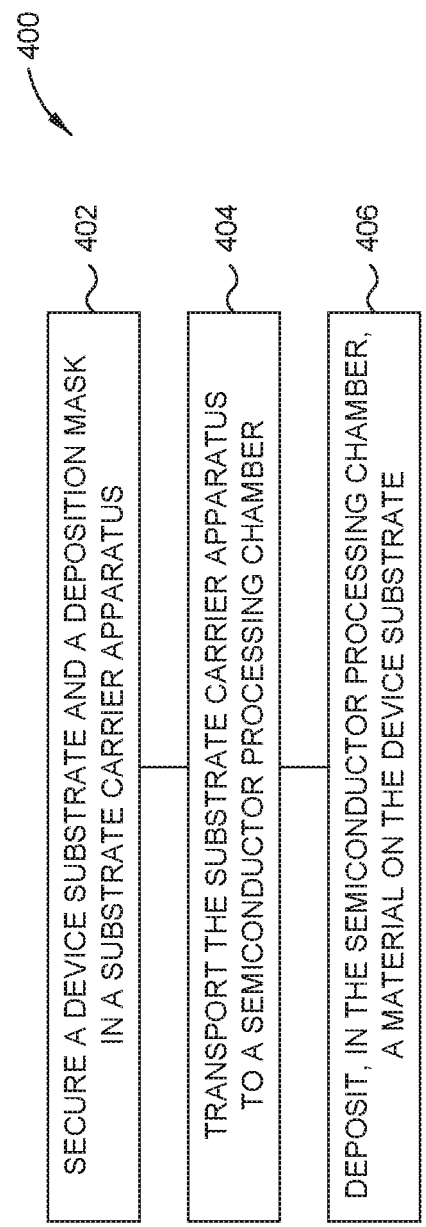
FIG. 22 is a flow chart of a method for semiconductor processing according to some examples.

FIG. 22 is a flow chart of a method 400 for semiconductor processing. The method 400 can be performed in a cluster tool comprising multiple semiconductor processing chambers, for example. The cluster tool and semiconductor processing chambers can be maintained at a vacuum or low pressure during the method 400. In some examples, a processing chamber of the cluster tool includes a holding chamber for storing one or more deposition masks. Another processing chamber can include an alignment chamber for aligning a device substrate and a deposition mask in a substrate carrier apparatus and securing the device substrate and deposition mask in the substrate carrier apparatus. Another processing chamber can include a deposition chamber, such as for evaporation deposition. A transfer chamber including a transfer robot can be connected to the other processing chambers and can be configured to transfer different substrates, deposition masks, and/or substrate carrier apparatuses to/from and between the other processing chambers.

In block 402, a device substrate and a deposition mask are secured in a substrate carrier apparatus. For example, a device substrate and a deposition mask can be secured in a substrate carrier apparatus as shown in FIG. 21. The deposition mask can be the deposition masks of FIGS. 5, 10, and 18A-B, 19, and 20, for example. As an example, a transfer robot of the transfer chamber can transfer a substrate carrier apparatus to an alignment chamber. The transfer robot also transfers a deposition mask, such as from a holding chamber, and a device substrate, such as from a loadlock or other storage chamber, to the alignment chamber. The alignment chamber includes various optical alignment and stepper equipment to align the substrate carrier apparatus, device substrate, and deposition mask. The device substrate and deposition mask, once aligned, are then secured in the substrate carrier apparatus.

In block 404, the substrate carrier apparatus (with the device substrate and deposition mask secured therein) is transferred to a semiconductor processing chamber. For example, the transfer robot can transfer the substrate carrier apparatus from the alignment chamber to a deposition chamber.

In block 406, a material is deposited, in the semiconductor processing chamber, on the device substrate through the mask openings of the deposition mask. The material is deposited through the substrate opening of the annular substrate and the mask openings aligned within the substrate opening and through the mask layer(s). For example, an evaporation deposition of an organic material may be performed. The organic material can be deposited through the substrate opening and the mask openings of the deposition mask. In some examples, the mask openings can have an aspect ratio of 1:1 or less, which can reduce a chance of pinch-off occurring at the mask openings during the deposition process. In some examples, an electrical current can be flowed through a conductive mask layer to generate heat at the conductive mask layer. For example, electrical power can be provided at contact areas 214, 216. Electrical current can flow in an a-direction through a-direction lines formed in the first conductive mask layer 204 between contact areas 214, and electrical current can flow in a b-direction through b-direction lines formed in the second conductive mask layer 208 between contact areas 216. The conductive mask layers 204, 208 form resistive heating elements which generate heat by electrical current flowing through the conductive mask layers 204, 208. Generating heat in the conductive mask layers 204, 208 can reduce the deposition of material on the deposition mask.

Some examples include a method for forming a deposition mask. A mask layer is deposited on a substrate. Mask openings are patterned through the mask layer. A central portion of the substrate is removed to define a substrate opening through a periphery portion of the substrate. The mask layer with the mask openings through the mask layer extends across the substrate opening.

In further examples of the above method, the mask openings through the mask layer can have a ratio of a depth of the respective mask opening to a width of the respective mask opening that is 1:1 or less.

In further examples of the above method, the mask layer can be deposited with a tensile stress.

In further examples, the above method can further comprise depositing a first protective layer on the substrate, the mask layer being deposited on the first protective layer; depositing a second protective layer on the mask layer, the mask openings being patterned through the first protective layer and the second protective layer; and removing portions of the first protective layer and the second protective layer.

In further examples, the above method can further comprise depositing a spacer layer on the mask layer; and patterning the spacer layer into a spacer element, scribe line areas being defined between groups of the mask openings, the spacer element being along at least some of the scribe line areas.

In further examples, the above method can further comprise forming a support matrix on the mask layer and in the substrate opening, scribe line areas being defined between groups of the mask openings, the support matrix being along at least some of the scribe line areas and contacting the periphery portion of the substrate.

In further examples of the above method, depositing the mask layer on the substrate can include: depositing a first conductive mask layer on the substrate; depositing an insulator mask layer on the first conductive mask layer; and depositing a second conductive mask layer on the insulator mask layer. In further examples, patterning the mask openings through the mask layer can include: patterning first trenches through the second conductive mask layer; and patterning, through the substrate opening, second trenches through the first conductive mask layer. At least the first trenches, the second trenches, or a combination thereof can be through the insulator mask layer, and intersections of the first trenches and the second trenches can form the mask openings.

In further examples, the above method can further comprise attaching a carrier frame to the mask layer and the substrate, an outer frame of the carrier frame circumscribing the periphery portion of the substrate.

Some examples include a semiconductor processing structure comprising: a deposition mask comprising: an annular substrate having a substrate opening through the annular substrate; and a mask layer on the annular substrate and extending across the substrate opening, the mask layer having mask openings through the mask layer and aligned within the substrate opening.

In further examples of the above semiconductor processing structure, the mask openings through the mask layer can have a ratio of a depth of the respective mask opening to a width of the respective mask opening that is 1:1 or less.

In further examples of the above semiconductor processing structure, the deposition mask can further comprise a spacer element on the mask layer opposite from the annular substrate, scribe line areas being defined between groups of the mask openings, the spacer element being along at least some of the scribe line areas.

In further examples of the above semiconductor processing structure, the deposition mask can further comprise a support matrix on the mask layer and in the substrate opening, scribe line areas being defined between groups of the mask openings, the support matrix being along at least some of the scribe line areas and contacting the annular substrate.

In further examples of the above semiconductor processing structure, wherein the mask layer can include: a first conductive mask layer on the annular substrate, first trenches being through the first conductive mask layer; an insulator mask layer on the first conductive mask layer; and a second conductive mask layer on the insulator mask layer, second trenches being through the second conductive mask layer; at least the first trenches, the second trenches, or a combination thereof being through the insulator mask layer, intersections of the first trenches and the second trenches forming the mask openings.

In further examples, the above semiconductor processing structure can further comprise a carrier frame attached to the deposition mask, an outer frame of the carrier frame circumscribing the annular substrate.

Some examples include a method for semiconductor processing. The method comprises: securing a device substrate and a deposition mask in a substrate carrier apparatus, the deposition mask being secured on the device substrate, the deposition mask comprising: an annular substrate having a substrate opening through the annular substrate; and a mask layer on the annular substrate and extending across the substrate opening, the mask layer having mask openings through the mask layer and aligned within the substrate opening; transporting the substrate carrier apparatus with the device substrate and the deposition mask secured therein to a semiconductor processing chamber; and depositing, in the semiconductor processing chamber, a material on the device substrate through the substrate opening and the mask openings.

In further examples of the above method, the mask openings through the mask layer can have a ratio of a depth of the respective mask opening to a width of the respective mask opening that is 1:1 or less.

In further examples of the above method, depositing the material through the substrate opening and the mask openings can include depositing an organic material using evaporation.

In further examples of the above method, the mask layer can include a conductive mask layer, and depositing the material through the substrate opening and the mask openings can include flowing an electrical current through the conductive mask layer.

In further examples of the above method, the deposition mask can include a spacer element on the mask layer, the spacer element being disposed between the device substrate and the mask layer when the device substrate and the deposition mask are secured in the substrate carrier apparatus.

While the foregoing is directed to various examples of the present disclosure, other and further examples may be devised without departing from the basic scope thereof, and the scope thereof is determined by the claims that follow.

The invention claimed is:

1. A method for forming a deposition mask, the method comprising:
   depositing a mask layer on a substrate;
   patterning mask openings through the mask layer; and
   removing a central portion of the substrate to define a substrate opening through a periphery portion of the substrate, the mask layer with the mask openings through the mask layer extending across the substrate opening, wherein the mask openings through the mask layer have a ratio of a depth of the respective mask opening to a width of the respective mask opening that is 1:1 or less.

2. The method of claim 1, wherein the mask openings through the mask layer have a depth of about 2 μm to about 3 μm and the respective mask opening has a width of about 2 μm to about 3 μm.

3. The method of claim 1, wherein the mask layer is deposited with a tensile stress.

4. The method of claim 1 further comprising:
depositing a first protective layer on the substrate, the mask layer being deposited on the first protective layer;
depositing a second protective layer on the mask layer, the mask openings being patterned through the first protective layer and the second protective layer; and
removing portions of the first protective layer and the second protective layer.

5. The method of claim 1 further comprising:
depositing a spacer layer on the mask layer; and
patterning the spacer layer into a spacer element, scribe line areas being defined between groups of the mask openings, the spacer element being along at least some of the scribe line areas.

6. The method of claim 1 further comprising:
forming a support matrix on the mask layer and in the substrate opening, scribe line areas being defined between groups of the mask openings, the support matrix being along at least some of the scribe line areas and contacting the periphery portion of the substrate.

7. The method of claim 1, wherein depositing the mask layer on the substrate includes:
depositing a first conductive mask layer on the substrate;
depositing an insulator mask layer on the first conductive mask layer; and
depositing a second conductive mask layer on the insulator mask layer.

8. The method of claim 7, wherein patterning the mask openings through the mask layer includes:
patterning first trenches through the second conductive mask layer; and
patterning, through the substrate opening, second trenches through the first conductive mask layer, at least the first trenches, the second trenches, or a combination thereof being through the insulator mask layer, intersections of the first trenches and the second trenches forming the mask openings.

9. The method of claim 1 further comprising attaching a carrier frame to the mask layer and the substrate, an outer frame of the carrier frame circumscribing the periphery portion of the substrate.

10. A semiconductor processing structure comprising:
a deposition mask comprising:
an annular substrate having a substrate opening through the annular substrate; and
a mask layer on the annular substrate and extending across the substrate opening, the mask layer having mask openings through the mask layer and aligned within the substrate opening, wherein the mask openings through the mask layer have a ratio of a depth of the respective mask opening to a width of the respective mask opening that is 1:1 or less.

11. The semiconductor processing structure of claim 10, wherein the mask openings through the mask layer have a depth of about 2 μm to about 3 μm and the respective mask opening has a width of about 2 μm to about 3 μm.

12. The semiconductor processing structure of claim 10, wherein the deposition mask further comprises a spacer element on the mask layer opposite from the annular substrate, scribe line areas being defined between groups of the mask openings, the spacer element being along at least some of the scribe line areas.

13. The semiconductor processing structure of claim 10, wherein the deposition mask further comprises a support matrix on the mask layer and in the substrate opening, scribe line areas being defined between groups of the mask openings, the support matrix being along at least some of the scribe line areas and contacting the annular substrate.

14. The semiconductor processing structure of claim 10, wherein the mask layer includes:
a first conductive mask layer on the annular substrate, first trenches being through the first conductive mask layer;
an insulator mask layer on the first conductive mask layer; and
a second conductive mask layer on the insulator mask layer, second trenches being through the second conductive mask layer; at least the first trenches, the second trenches, or a combination thereof being through the insulator mask layer, intersections of the first trenches and the second trenches forming the mask openings.

15. The semiconductor processing structure of claim 10 further comprising a carrier frame attached to the deposition mask, an outer frame of the carrier frame circumscribing the annular substrate.

* * * * *